US012646691B2

(12) United States Patent
Takebayashi et al.

(10) Patent No.: US 12,646,691 B2
(45) Date of Patent: Jun. 2, 2026

(54) WAFER PLACEMENT TABLE

(71) Applicant: NGK Insulators, Ltd., Nagoya-City (JP)

(72) Inventors: Hiroshi Takebayashi, Handa-City (JP); Tatsuya Kuno, Nagoya-City (JP); Seiya Inoue, Handa-City (JP)

(73) Assignee: NGK INSULATORS, LTD., Nagoya (JP)

( * ) Notice: Subject to any disclaimer, the term of this patent is extended or adjusted under 35 U.S.C. 154(b) by 707 days.

(21) Appl. No.: 17/805,237

(22) Filed: Jun. 3, 2022

(65) Prior Publication Data

US 2023/0057107 A1     Feb. 23, 2023

(30) Foreign Application Priority Data

Aug. 17, 2021   (JP) ................................. 2021-132886

(51) Int. Cl.
*H01J 37/32*          (2006.01)
*C23C 16/458*          (2006.01)

(52) U.S. Cl.
CPC .... *H01J 37/32642* (2013.01); *C23C 16/4586* (2013.01); *H01J 37/32532* (2013.01); *H01J 37/32724* (2013.01)

(58) Field of Classification Search
CPC ....... C30B 25/08; C30B 29/403; C30B 25/14; C30B 25/165; C23C 16/303; C23C 16/4482; C23C 16/52; C23C 16/4408; C23C 16/45525; C23C 16/4583; C23C 16/448; C23C 16/45544; C23C 16/455;

C23C 16/4481; C23C 16/507; C23C 16/509; C23C 16/5096; C23C 16/45565; G01F 23/0007; G01F 23/04; B01J 4/008; B67D 7/3263; B67D 7/0238; H01J 15/00; H01J 37/32091; H01J 37/32082;
(Continued)

(56) References Cited

U.S. PATENT DOCUMENTS

| | | | |
|---|---|---|---|
| 5,886,863 A | 3/1999 | Nagasaki et al. | |
| 10,153,138 B2 * | 12/2018 | Aoto ................. | H01J 37/32091 |
| 11,610,798 B2 * | 3/2023 | Kuno ................ | H01J 37/32642 |

(Continued)

FOREIGN PATENT DOCUMENTS

| | | |
|---|---|---|
| CN | 1551293 A | 12/2004 |
| CN | 102110632 A | 6/2011 |

(Continued)

OTHER PUBLICATIONS

Google Machine Translation for JP2011108816A (Year: 2025).*
(Continued)

*Primary Examiner* — Rudy Zervigon
(74) *Attorney, Agent, or Firm* — BURR PATENT LAW, PLLC

(57) ABSTRACT

A wafer placement table includes a ceramic base, a cooling base, and a bonding layer. The ceramic base includes an outer peripheral part having an annular focus ring placement surface on an outer peripheral side of a central part having a circular wafer placement surface. The cooling base contains metal. The bonding layer bonds the ceramic base with the cooling base. The outer peripheral part of the ceramic base has a thickness of less than or equal to 1 mm and does not incorporate an electrode.

8 Claims, 7 Drawing Sheets

(58) Field of Classification Search

CPC ............. H01J 37/3244; H01J 37/32623; H01J 37/32009; H01J 37/32532; H01L 21/67069

USPC ........... 118/726, 727, 723 E, 723 ER; 269/1; 279/1; 156/345.29, 345.37, 345.43, 156/345.44, 345.45, 345.46, 345.47

See application file for complete search history.

(56) References Cited

U.S. PATENT DOCUMENTS

| | | | |
|---|---|---|---|
| 2004/0261946 A1* | 12/2004 | Endoh | H01J 37/32642 156/345.1 |
| 2005/0042881 A1 | 2/2005 | Nishimoto et al. | |
| 2006/0279899 A1* | 12/2006 | Aihara | H01L 21/6831 361/234 |
| 2008/0006207 A1 | 1/2008 | Miyagawa et al. | |
| 2011/0116207 A1 | 5/2011 | Sato et al. | |
| 2014/0069585 A1* | 3/2014 | Aoto | H01J 37/32807 156/345.52 |
| 2014/0159325 A1* | 6/2014 | Parkhe | H01L 21/67109 156/154 |
| 2016/0035610 A1* | 2/2016 | Park | H01L 21/6833 165/80.2 |
| 2018/0108556 A1 | 4/2018 | Takebayashi | |
| 2018/0350561 A1 | 12/2018 | Yamaguchi et al. | |
| 2019/0013230 A1* | 1/2019 | Taga | H01L 21/68757 |
| 2020/0035538 A1* | 1/2020 | Momiyama | B23Q 3/15 |
| 2021/0175109 A1 | 6/2021 | Sato et al. | |

FOREIGN PATENT DOCUMENTS

| | | |
|---|---|---|
| CN | 104823274 A | 8/2015 |
| CN | 109216253 A | 1/2019 |
| JP | H09-237826 A | 9/1997 |
| JP | 2008-016727 A | 1/2008 |
| JP | 2011-108816 A | 6/2011 |
| JP | 2014-053481 A | 3/2014 |
| JP | 2018-206804 A | 12/2018 |
| KR | 10-2017-0043402 A | 4/2017 |
| TW | 201135865 A1 | 10/2011 |
| TW | 201830513 A | 8/2018 |
| TW | 202111859 A | 3/2021 |

OTHER PUBLICATIONS

Machine Translation.*

Watanabe et al, Effect of Additives on the Electrostatic Force of Alumina Electrostatic Chucks. Jun. 1, 1992. Journal of the Ceramic Society of Japan, 100 [1], pp. 1.*

Japanese Office Action (with English translation) dated Jan. 30, 2024 (Application No. 2021-132886).

Taiwanese Office Action (Application No. 111124249) dated Apr. 26, 2023 (7 pages).

Korean Office Action (with English translation) dated Feb. 26, 2024 (Application No. 10-2022-0082402).

Chinese Office Action (Application No. 202210709442.8) dated Mar. 28, 2025 (with English translation) (15 pages).

Chinese Office Action (with English translation) dated Jun. 8, 2025 (Application No. 202210709442.8).

* cited by examiner

Fig. 3A
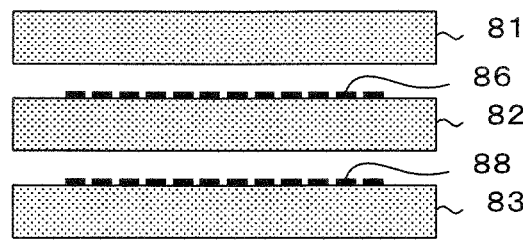
Fig. 3B
Fig. 3C
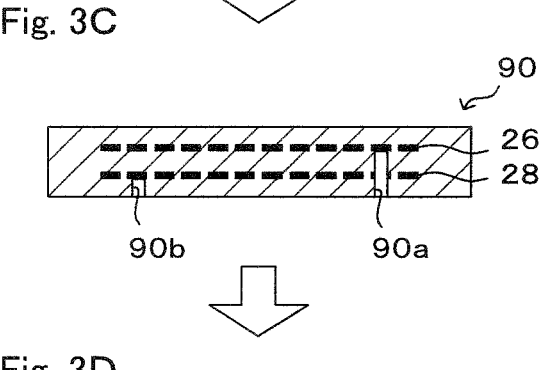
Fig. 3D
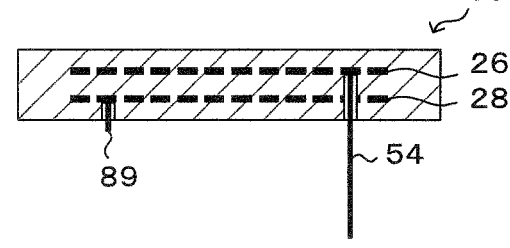
Fig. 3E
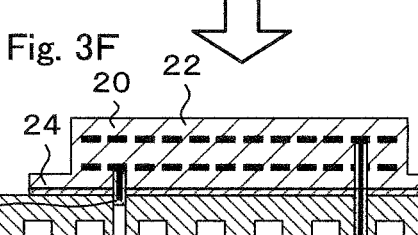
Fig. 3F
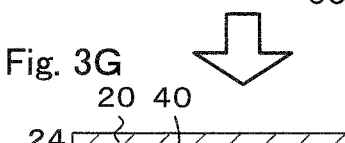
Fig. 3G
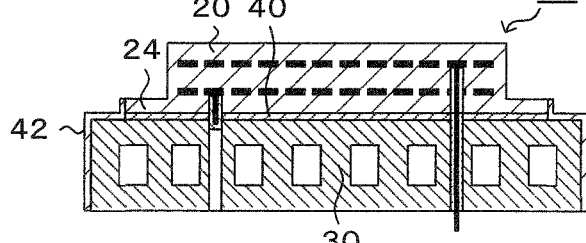

WAFER PLACEMENT TABLE

BACKGROUND OF THE INVENTION

1. Field of the Invention

The present invention relates to a wafer placement table.

2. Description of the Related Art

A wafer placement table is used to perform CVD, etching, or the like on a wafer by using plasma. For example, a wafer placement table described in Patent Literature 1 includes a ceramic base and a cooling base, and the ceramic base includes a central part having a circular wafer placement surface and an outer peripheral part having an annular focus ring placement surface on the outer peripheral side of the central part. A wafer placed on the wafer placement surface is electrostatically attracted to the wafer placement surface by applying a direct current voltage to a wafer attracting electrode embedded in the central part of the ceramic base. A focus ring placed on the focus ring placement surface is electrostatically attracted to the focus ring placement surface by applying a direct current voltage to a focus ring attracting electrode embedded in the outer peripheral part of the ceramic base. A first radio-frequency power supply that generates a source radio frequency for generating plasma and a second radio-frequency power supply that generates a bias radio frequency for drawing ions to a wafer are connected to the cooling base. Generally, a bias radio frequency is lower in frequency and greater in amplitude than a source radio frequency.

CITATION LIST

Patent Literature

PTL 1: JP 2018-206804 A

SUMMARY OF THE INVENTION

However, in the wafer placement table described in Patent Literature 1, the focus ring attracting electrode is embedded in the outer peripheral part of the ceramic base, so there is an inconvenience that it is inefficient to draw ions to the focus ring by the bias radio frequency. In other words, when the focus ring attracting electrode is embedded in the outer peripheral part of the ceramic base, the outer peripheral part needs to be thickened. Then, the distance between the focus ring placement surface and the cooling base to which the bias radio frequency is applied increases. As a result, the reactance between the cooling base and the focus ring placement surface increases, so it is inefficient to draw ions to the focus ring by the bias radio frequency. Particularly, since the bias radio frequency is lower in frequency than the source radio frequency, the reactance tends to increase.

The present invention is made to solve such inconvenience, and it is a main object to efficiently draw ions to a focus ring by a bias radio frequency.

A wafer placement table of the present invention includes a ceramic base that includes an outer peripheral part having an annular focus ring placement surface on an outer peripheral side of a central part having a circular wafer placement surface, a cooling base containing metal, and a bonding layer that bonds the ceramic base with the cooling base, wherein the outer peripheral part of the ceramic base has a thickness of less than or equal to 1 mm and does not incorporate an electrode.

In this wafer placement table, the outer peripheral part of the ceramic base does not incorporate an electrode and has a thickness of less than or equal to 1 mm. Therefore, when a focus ring attracting voltage is applied to the cooling base, a focus ring is able to be electrostatically attracted to the focus ring placement surface. When a bias radio-frequency voltage is applied to the cooling base, the reactance between the cooling base and the focus ring placement surface reduces, so it is possible to efficiently draw ions to the focus ring by the bias radio-frequency voltage.

In the wafer placement table of the present invention, the cooling base may be connected to at least a focus ring attracting electrode, a source radio-frequency power supply, and a bias radio-frequency power supply. With this configuration, the cooling base is able to be used as the focus ring attracting electrode, the source radio-frequency electrode, and the bias radio-frequency electrode.

In the wafer placement table of the present invention, the bonding layer may be a metal bonding layer. With this configuration, the bonding layer may be regarded as part of the cooling base. Therefore, it is possible to further reduce the reactance between the cooling base and the focus ring placement surface as compared to the case where the bonding layer is an electrically insulating layer, such as a resin. In this case, a periphery of the metal bonding layer is preferably coated with an electrically insulating material such that the metal bonding layer is not exposed. With this configuration, the metal bonding layer is able to be protected.

In the wafer placement table of the present invention, the central part of the ceramic base may be thicker than the outer peripheral part, may incorporate a wafer attracting electrode, and may incorporate a radio-frequency electrode between the wafer attracting electrode and a surface on a side opposite to the wafer placement surface, the radio-frequency electrode may be connected to the cooling base, and the wafer attracting electrode may be connected to a wafer attracting power supply without being connected to the cooling base.

In the wafer placement table of the present invention, the central part of the ceramic base may be thicker than the outer peripheral part, may incorporate a wafer attracting electrode, and does not need to incorporate a radio-frequency electrode between the wafer attracting electrode and a surface on a side opposite to the wafer placement surface, and the wafer attracting electrode may be connected to a wafer attracting power supply without being connected to the cooling base. With this configuration, the structure is simplified as compared to the case where the radio-frequency electrode is incorporated in the ceramic base.

In the wafer placement table of the present invention, the central part of the ceramic base may be thicker than the outer peripheral part, may incorporate a wafer attracting electrode, and does not need to incorporate a radio-frequency electrode between the wafer attracting electrode and a surface on a side opposite to the wafer placement surface, the wafer attracting electrode may be connected to the cooling base, and the cooling base may be connected to a wafer attracting power supply. With this configuration, the structure is simplified as compared to the case where the wafer attracting electrode is connected to the wafer attracting power supply without being connected to the cooling base. The wafer attracting electrode also functions as the radio-frequency electrode.

In the wafer placement table of the present invention, the central part of the ceramic base may have the same thickness as the outer peripheral part of the ceramic base, does not need to incorporate an electrode, and the cooling base may be connected to a wafer attracting power supply. With this configuration, it is possible to reduce the overall thickness of the ceramic base, and the structure is also simplified.

In the wafer placement table of the present invention, the cooling base does not need to have a through-hole for supplying electric power. With this configuration, it is possible to suppress generation of a temperature singular point.

In the wafer placement table of the present invention, a difference in coefficient of thermal expansion between the ceramic base and the cooling base may be lower than or equal to $1 \times 10^{-6}$/K. With this configuration, durability increases even when the wafer placement table is repeatedly used at high and low temperatures. For example, when the ceramic base is made of alumina, the cooling base is preferably made of SiSiCTi or AlSiC.

BRIEF DESCRIPTION OF THE DRAWINGS

FIGS. 3A to 3G are manufacturing process charts of the wafer placement table 10.

DETAILED DESCRIPTION OF THE INVENTION

Figure 1:
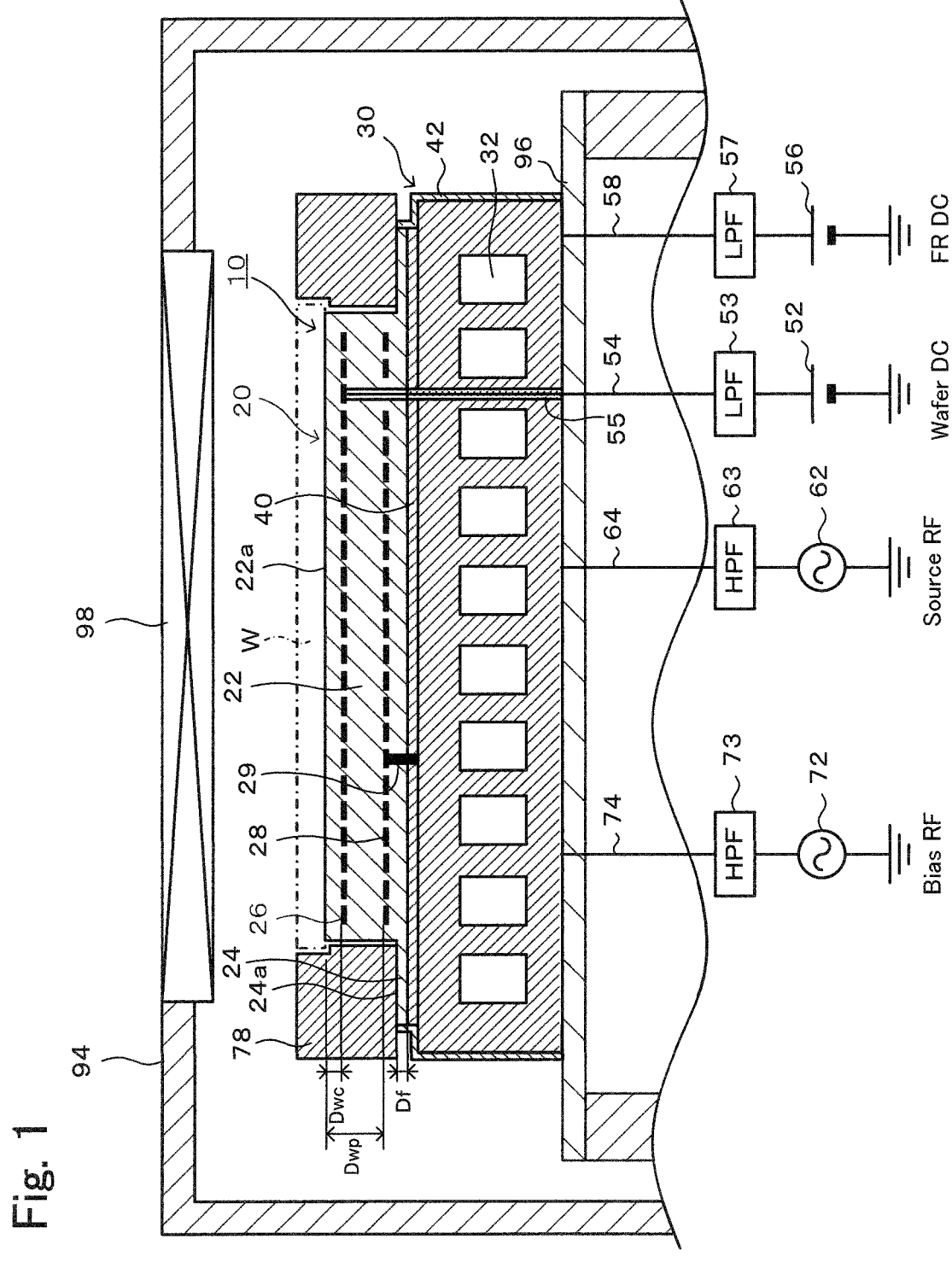
FIG. 1 is a longitudinal sectional view of a wafer placement table 10.
Figure 2:
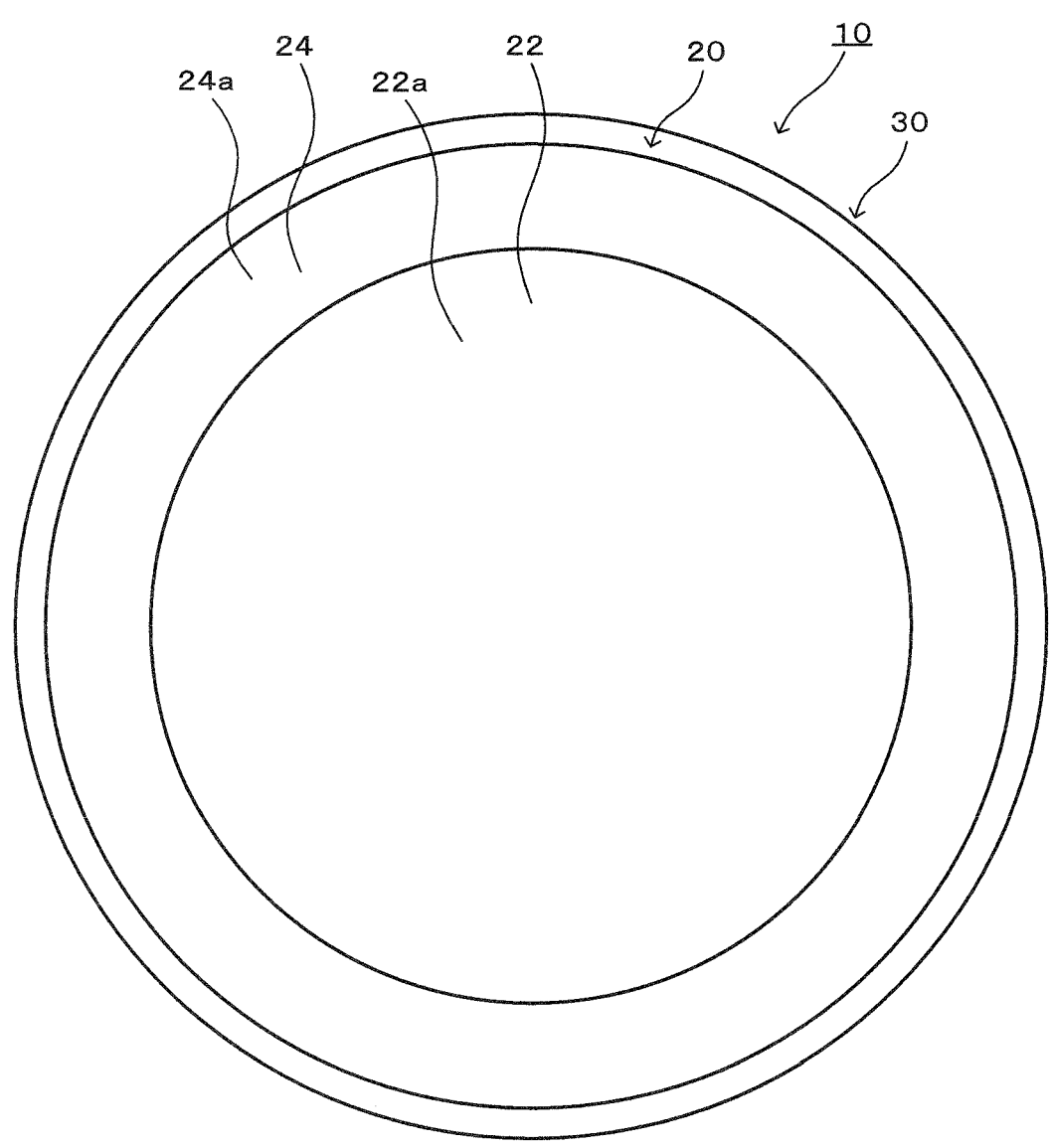
FIG. 2 is a plan view of the wafer placement table 10.

A preferred embodiment of the present invention will be described below with reference to the drawings. FIG. 1 is a longitudinal sectional view of a wafer placement table 10 (a sectional view taken along a plane including the central axis of the wafer placement table 10). FIG. 2 is a plan view of the wafer placement table 10 (where a focus ring 78 is omitted). In the following description, up and down, right and left, front and rear, and the like can be used for illustration; however, up and down, right and left, and front and rear are only relative positional relationships. In the specification, "X to Y" indicating a numeric range is used as a meaning of including numeric values X and Y as a lower limit value and an upper limit value.

The wafer placement table 10 is used to perform CVD, etching, or the like on a wafer W by using plasma, and is fixed to a mounting plate 96 provided inside a semiconductor process chamber 94. The wafer placement table 10 includes a ceramic base 20, a cooling base 30, and a bonding layer 40.

The ceramic base 20 includes an outer peripheral part 24 having an annular focus ring placement surface 24a, on the outer peripheral side of a central part 22 having a circular wafer placement surface 22a. Hereinafter, a focus ring may be abbreviated as "FR". A wafer W is placed on the wafer placement surface 22a, and a focus ring 78 is placed on the FR placement surface 24a. The ceramic base 20 is made of a ceramic material, typically, alumina, aluminum nitride, or the like. The FR placement surface 24a is lower in level than the wafer placement surface 22a. The outer peripheral part 24 does not incorporate an electrode (an FR attracting electrode or a radio-frequency (RF) electrode). The thickness of the outer peripheral part 24 is less than or equal to 1 mm, preferably less than or equal to 0.7 mm, and more preferably less than or equal to 0.5 mm.

The central part 22 of the ceramic base 20 incorporates a wafer attracting electrode 26 and an RF electrode 28 in order from the side close to the wafer placement surface 22a. These electrodes 26, 28 are made of a material that contains, for example, W, Mo, WC, MoC, or the like. The wafer attracting electrode 26 is a disc-shaped or mesh-shaped single-pole electrostatic electrode. A layer of the ceramic base 20 on the upper side of the wafer attracting electrode 26 functions as a dielectric layer. A wafer attracting direct current power supply 52 is connected to the wafer attracting electrode 26 via a power supply terminal 54. The power supply terminal 54 is provided so as to pass through an electrically insulating tube 55 disposed in a through-hole extending through the cooling base 30 and the bonding layer 40 in the up and down direction and reach the wafer attracting electrode 26 from the bottom surface of the ceramic base 20. The power supply terminal 54 is provided so as to be electrically insulated from the RF electrode 28. A low pass filter (LPF) 53 is provided in the power supply terminal 54 between the wafer attracting direct current power supply 52 and the wafer attracting electrode 26. The RF electrode 28 is provided in the central part 22 of the ceramic base 20 between the wafer attracting electrode 26 and the bottom surface of the ceramic base 20. The RF electrode 28 functions as a wafer-side source RF electrode and bias RF electrode. The RF electrode 28 is electrically continuous with the bonding layer 40 and the cooling base 30 by way of a via 29 extending from the RF electrode 28 toward the cooling base.

The cooling base 30 is an electrically conductive disc member containing metal. The cooling base 30 has a refrigerant flow channel 32 in which refrigerant is able to circulate. The refrigerant flow channel 32 is connected to a refrigerant supply passage and a refrigerant discharge passage (not shown), and refrigerant discharged from the refrigerant discharge passage is adjusted in temperature and then returned to the refrigerant supply passage again. The cooling base 30 is made of an electrically conductive material containing metal. Examples of the electrically conductive material include a composite material and a metal. Examples of the composite material include a metal composite material (also called metal matrix composite (MMC)). Examples of the MMC include a material including Si, SiC, and Ti, and a material that impregnates an SiC porous body with Al and/or Si. The material including Si, SiC, and Ti is referred to as SiSiCTi, the material that impregnates an SiC porous body with Al is referred to as AlSiC, and the material that impregnates an SiC porous body with Si is referred to as SiSiC. Examples of the metal include Ti, Mo, Al, and alloys of them.

The cooling base 30 is connected to an FR attracting direct current power supply 56 via a power supply terminal 58, is connected to a source RF power supply 62 via a power supply terminal 64, and is connected to a bias RF power supply 72 via a power supply terminal 74. An LPF 57 is disposed between the cooling base 30 and the FR attracting direct current power supply 56, a high pass filter (HPF) 63 is disposed between the cooling base 30 and the source RF power supply 62, and an HPF 73 is disposed between the cooling base 30 and the bias RF power supply 72. A bias RF is lower in frequency and greater in amplitude than a source RF. The frequency of the source RF is, for example, several tens to several hundreds of MHz, and the frequency of the bias RF is, for example, several hundreds of kHz.

The bonding layer 40 bonds the bottom surface of the ceramic base 20 with the top surface of the cooling base 30. In the present embodiment, the bonding layer 40 is a metal bonding layer. The metal bonding layer may be, for example, a layer made of solder or a brazing metal material. The metal bonding layer is formed by, for example, TCB (thermal compression bonding). TCB is a known method of sandwiching a metal bonding material between two members to be bonded and bonding the two members in a state heated to a temperature lower than or equal to a solidus temperature of the metal bonding material. Parts not coated with the bonding layer 40 on the side surface of the outer peripheral part 24 of the ceramic base 20, the outer periphery of the bonding layer 40, the side surface of the cooling base 30, and the top surface of the cooling base 30 are coated with an electrically insulating film 42. Examples of the electrically insulating film 42 include a sprayed film made of alumina, yttria, or the like.

Next, an example of manufacturing of the wafer placement table 10 will be described with reference to FIGS. 3A to 3G. FIGS. 3A to 3G are manufacturing process charts of the wafer placement table 10. Initially, disc-shaped first to third ceramic molds 81 to 83 are made by mold casting, and electrode patterns 86, 88 are respectively formed by printing electrode paste on the top surfaces of the second and third ceramic molds 82, 83 (see FIG. 3A). Mold casting is a known method of injecting ceramic slurry containing ceramic raw material powder and a molding agent into a die and molding the ceramic slurry by causing the chemical reaction of the molding agent in the die. Examples of the molding agent include isocyanate and polyol. The molding agent may be the one molded by urethane reaction. The electrode paste is, for example, slurry obtained by adding ceramic powder to an electrically conductive material, such as W, Mo, WC, and MoC. The electrode pattern 86 printed on the top surface of the second ceramic mold 82 has the same shape as the wafer attracting electrode 26, and electrode pattern 88 printed on the top surface of the third ceramic mold 83 has the same shape as the RF electrode 28.

Subsequently, the first ceramic mold 81, the second ceramic mold 82 on the top surface of which the electrode pattern 86 is printed, and the third ceramic mold 83 on the top surface of which the electrode pattern 88 is printed are laminated, and the obtained layered body is fired by hot pressing, with the result that a ceramic sintered body 90 is obtained (see FIG. 3B). Thus, the electrode pattern 86 becomes the wafer attracting electrode 26, and the electrode pattern 88 becomes the RF electrode 28.

Subsequently, shape and thickness are adjusted by grinding, blasting, or the like on both surfaces of the obtained ceramic sintered body 90, and holes in the up and down direction (a hole 90a for inserting the power supply terminal 54, a hole 90b for inserting the via 29, and the like) are formed (see FIG. 3C).

Subsequently, the power supply terminal 54 is inserted into the hole 90a of the ceramic sintered body 90 and bonded to the wafer attracting electrode 26, and a connection terminal 89 is inserted into the hole 90b and bonded to the RF electrode 28 (FIG. 3D). After that, the ceramic sintered body 90 and the cooling base 30 are bonded by the bonding layer 40 to obtain a bonded body 92 (FIG. 3E). Holes 30a, 30b are provided in the cooling base 30 in advance so as to extend through in the up and down direction at locations respectively corresponding to the holes 90a, 90b of the ceramic sintered body 90, and, at the time of bonding, the power supply terminal 54 is inserted into the hole 30a, and the connection terminal 89 is inserted into the hole 30b. When the ceramic sintered body 90 is made of alumina, the cooling base 30 is preferably made of SiSiCTi or AlSiC.

An SiSiCTi plate, for example, contains one or more raw materials selected so as to contain 39 to 51 percent by mass of silicon carbide raw material particles with an average particle diameter of greater than or equal to 10 µm and less than or equal to 25 µm and contain Ti and Si, and a powder mixture with a mass ratio Si/(Si+Ti) of 0.26 to 0.54 for Si and Ti from the raw materials excluding silicon carbide is made. For example, silicon carbide, metal Si, and metal Ti may be used as raw materials. In this case, mixing is preferably performed such that silicon carbide is 39 to 51 percent by mass, metal Si is 16 to 24 percent by mass, and metal Ti is 26 to 43 percent by mass. After that, a disc-shaped mold is made by uniaxial pressing of the obtained powder mixture, and the mold is sintered in the range of 1370° C. to 1460° C. by hot pressing in an inert atmosphere, with the result that the SiSiCTi plate is obtained.

Bonding between the ceramic sintered body 90 and the cooling base 30 is performed by using a metal bonding material. For example, a metal bonding material is held between the alumina ceramic sintered body 90 and the SiSiCTi cooling base 30 to achieve TCB bonding. Specifically, a layered body of the ceramic sintered body 90 and the cooling base 30 is pressurized at a temperature lower than or equal to a solidus temperature of the metal bonding material (for example, higher than or equal to a temperature obtained by subtracting 20° C. from the solidus temperature and lower than or equal to the solidus temperature) to perform TCB bonding, after that the temperature is returned to a room temperature. Thus, the metal bonding material becomes the bonding layer 40. An Al—Mg bonding material or an Al—Si—Mg bonding material may be used as the metal bonding material at this time. When, for example, TCB bonding is performed by using an Al—Si—Mg bonding material (88.5 percent by weight of Al, 10 percent by weight of Si, 1.5 percent by weight of Mg, and a solidus temperature of about 560° C.), the ceramic sintered body 90 is pressurized at a pressure of 0.5 to 2.0 kg/mm² for several hours in a state of being heated to 540° C. to 560° C. under vacuum atmosphere. Holes are respectively provided in advance in the metal bonding material at locations facing the holes 30a, 30b of the cooling base 30 before TCB bonding. The metal bonding material with a thickness of about 100 µm is preferable.

Subsequently, the ceramic base 20 with the central part 22 and the outer peripheral part 24 is obtained by grinding the outer periphery of the ceramic sintered body 90 to form steps. The hole 30b of the cooling base 30, in which the connection terminal 89 is inserted, is filled with an electrically conductive material to provide a via 29, and the electrically insulating tube 55 is disposed in the hole 30a in which the power supply terminal 54 is inserted (FIG. 3F).

Subsequently, parts exposed on the side surface of the outer peripheral part 24 of the ceramic base 20, the periphery of the bonding layer 40, the side surface of the cooling base 30, and the top surface of the cooling base 30 are subjected to thermal spraying by using ceramic powder to form the electrically insulating film 42 (FIG. 3G). Thus, the wafer placement table 10 is obtained.

Next, an example of the use of the wafer placement table 10 will be described with reference to FIG. 1. The wafer placement table 10 is mounted on the mounting plate 96 of the chamber 94 as described above. A shower head 98 that discharges process gas from a large number of gas injection holes into the chamber 94 is disposed on the ceiling surface of the chamber 94.

A focus ring 78 is placed on the FR placement surface 24a of the wafer placement table 10, and a disc-shaped wafer W is placed on the wafer placement surface 22a. The focus ring 78 has a step along the inner periphery of an upper end part so as not to interfere with the wafer W. In this state, a wafer W is attracted to the wafer placement surface 22a by applying a direct current voltage of the wafer attracting direct current power supply 52 to the wafer attracting electrode 26. Together with this, the focus ring 78 is attracted to the FR placement surface 24a by applying a direct current voltage of the FR attracting direct current power supply 56 to the cooling base 30. Then, the inside of the chamber 94 is set to a predetermined vacuum atmosphere (or decompression atmosphere), and a source RF voltage from the source RF power supply 62 and a bias RF voltage from a bias RF power supply 72 are applied to the cooling base 30 while process gas is being supplied from the shower head 98. As a result, plasma is generated between the shower head 98 and the RF electrode 28 incorporated in the central part 22 of the ceramic base 20. Then, the wafer W is subjected to CVD deposition or etching by using the plasma. The source RF voltage is to be applied to generate plasma, and the bias RF voltage is to be applied to draw ions to the wafer W or the focus ring 78. As the wafer W is subjected to a plasma process, the focus ring 78 abrades; however, the focus ring 78 is thicker than the wafer W, replacement of the focus ring 78 is performed after processing a plurality of wafers W.

In the present embodiment, the thickness of the outer peripheral part 24 of the ceramic base 20 is less than or equal to 1 mm. Therefore, ions are efficiently drawn to the focus ring 78 by the bias RF voltage applied to the cooling base 30. Together with this, plasma is efficiently generated also in the air over the focus ring 78 by the source RF voltage applied to the cooling base 30. On the other hand, a direct current voltage is applied to the wafer attracting electrode 26 from the wafer attracting direct current power supply 52. Thus, the wafer W is attracted to the wafer placement surface 22a. Therefore, even with a high-temperature wafer W, it is possible to efficiently release heat from the wafer W to the cooling base 30. In addition, a direct current voltage from the FR attracting direct current power supply 56 is applied to the cooling base 30. Thus, the focus ring 78 is attracted to the FR placement surface 24a. Therefore, even with a high-temperature focus ring 78, it is possible to efficiently release heat from the focus ring 78 to the cooling base 30. Furthermore, since the thickness of the outer peripheral part 24 (which functions as a dielectric layer) of the ceramic base 20 is less than or equal to 1 mm, it is possible to attract the focus ring 78 to the FR placement surface 24a with sufficient force. Since the bonding layer 40 is a metal bonding layer and has a high thermal conductivity, it is possible to further efficiently release heat from the wafer W or the focus ring 78 to the cooling base 30.

In the above-described wafer placement table 10, the outer peripheral part 24 of the ceramic base 20 does not incorporate an electrode and has a thickness less than or equal to 1 mm. Therefore, when an FR attracting voltage is applied to the cooling base 30, the focus ring 78 is able to be electrostatically attracted to the FR placement surface 24a. When a bias RF voltage is applied to the cooling base 30, the reactance between the cooling base 30 and the FR placement surface 24a reduces, so it is possible to efficiently draw ions into the focus ring 78 by the bias RF voltage.

The cooling base 30 is connected to the FR attracting direct current power supply 56, the source RF power supply 62, and the bias RF power supply 72. Therefore, the cooling base 30 and the bonding layer 40 that is a metal bonding layer are able to be used as the FR attracting electrode, the FR-side source RF electrode, and the FR-side bias RF electrode.

In addition, since the bonding layer 40 is a metal bonding layer, the bonding layer 40 may be regarded as part of the cooling base 30. Therefore, it is possible to further reduce the reactance between the cooling base 30 and the focus ring placement surface 24a as compared to the case where the bonding layer 40 is an electrically insulating layer, such as a resin. Since the periphery of the bonding layer 40 is coated with the electrically insulating film 42 such that the bonding layer 40 is not exposed, it is possible to protect the bonding layer 40.

Furthermore, the central part 22 of the ceramic base 20 is thicker than the outer peripheral part 24, incorporates the wafer attracting electrode 26, and incorporates the RF electrode 28 between the wafer attracting electrode 26 and a surface on the side opposite to the wafer placement surface 22a. The RF electrode 28 is connected to the cooling base 30, and the wafer attracting electrode 26 is connected to the wafer attracting direct current power supply 52 without being connected to the cooling base 30. Therefore, in a state where the wafer W is attracted to the wafer placement surface 22a, plasma is efficiently generated in the air over the wafer W while ions are being drawn to the wafer W.

In addition, the ceramic base 20 is preferably an alumina substrate, and the cooling base 30 is preferably an SiSiCTi plate. With this configuration, since the difference in coefficient of thermal expansion between the ceramic base 20 and the cooling base 30 is small and is less than or equal to $1 \times 10^{-6}$/K, durability increases even when the ceramic base 20 and the cooling base 30 are repeatedly used at high and low temperatures. The coefficient of linear thermal expansion in the range of 40° C. to 570° C. is $7.7 \times 10^{-6}$/K for alumina and $7.8 \times 10^{-6}$/K for SiSiCTi.

The present invention is not limited to the above-described embodiment and may be, of course, implemented in various modes within the technical scope of the present invention.

Figure 4:
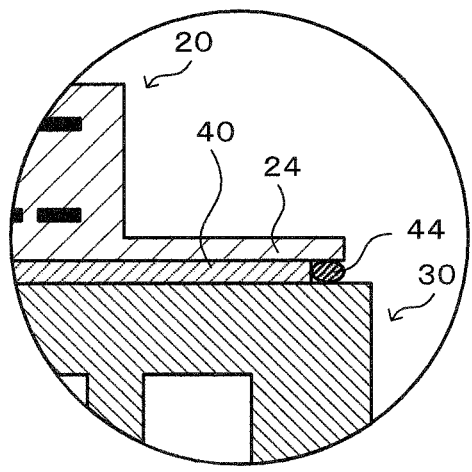
FIG. 4 is a partial cross-sectional view when an O-ring 44 is adopted instead of an electrically insulating film 42.
Figure 5:
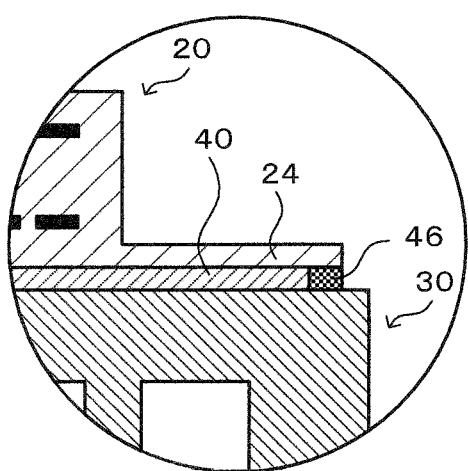
FIG. 5 is a partial cross-sectional view when a resin layer 46 is adopted instead of the electrically insulating film 42.

For example, in the above-described embodiment, the outer periphery of the bonding layer 40 is coated with the electrically insulating film 42. Instead, an O-ring 44 shown in FIG. 4 or a resin layer 46 shown in FIG. 5 may be adopted. In FIG. 4 and FIG. 5, like reference signs are assigned to components similar to those of the above-described embodiment. In FIG. 4, the O-ring 44 is disposed in the space surrounded by the outer peripheral part 24 of the ceramic base 20, the side surface of the bonding layer 40, and the top surface of the cooling base 30. In FIG. 5, the resin layer 46 is formed by filling the space with resin. The material of the O-ring 44 and the resin layer 46 is preferably the one having an electrical insulation property and is more preferably the one having an electrical insulation property and plasma resistance. Examples of the specific material include fluororesins (such as polytetrafluorocarbon) and silicone resins. Even when the O-ring 44 or the resin layer 46 is adopted, the bonding layer 40 is protected similarly as in the case of the electrically insulating film 42. In FIG. 4 and FIG. 5, parts not coated with the bonding layer 40 on the side surface of the cooling base 30 and the top surface of the cooling base 30 may be coated with an electrically insulating film (for example, a ceramic sprayed film).

Figure 6:
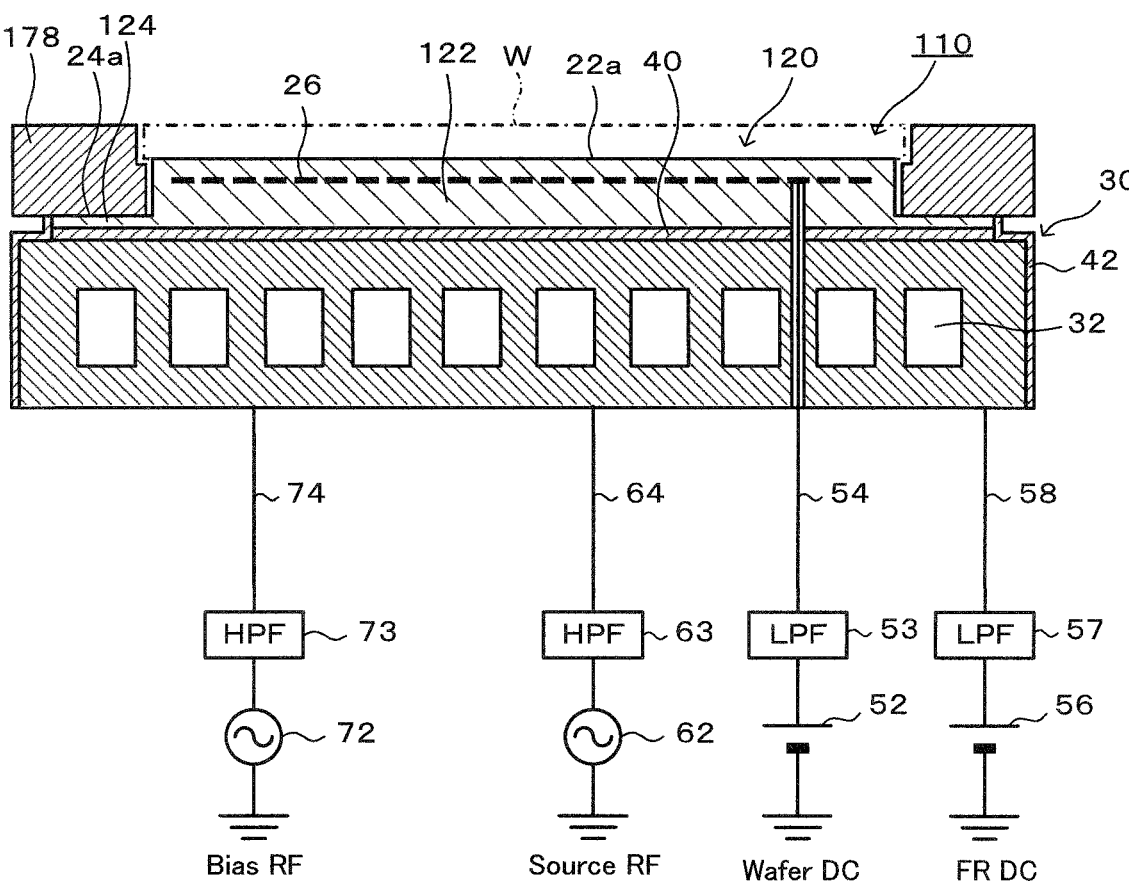
FIG. 6 is a longitudinal sectional view of a wafer placement table 110.
Figure 7:
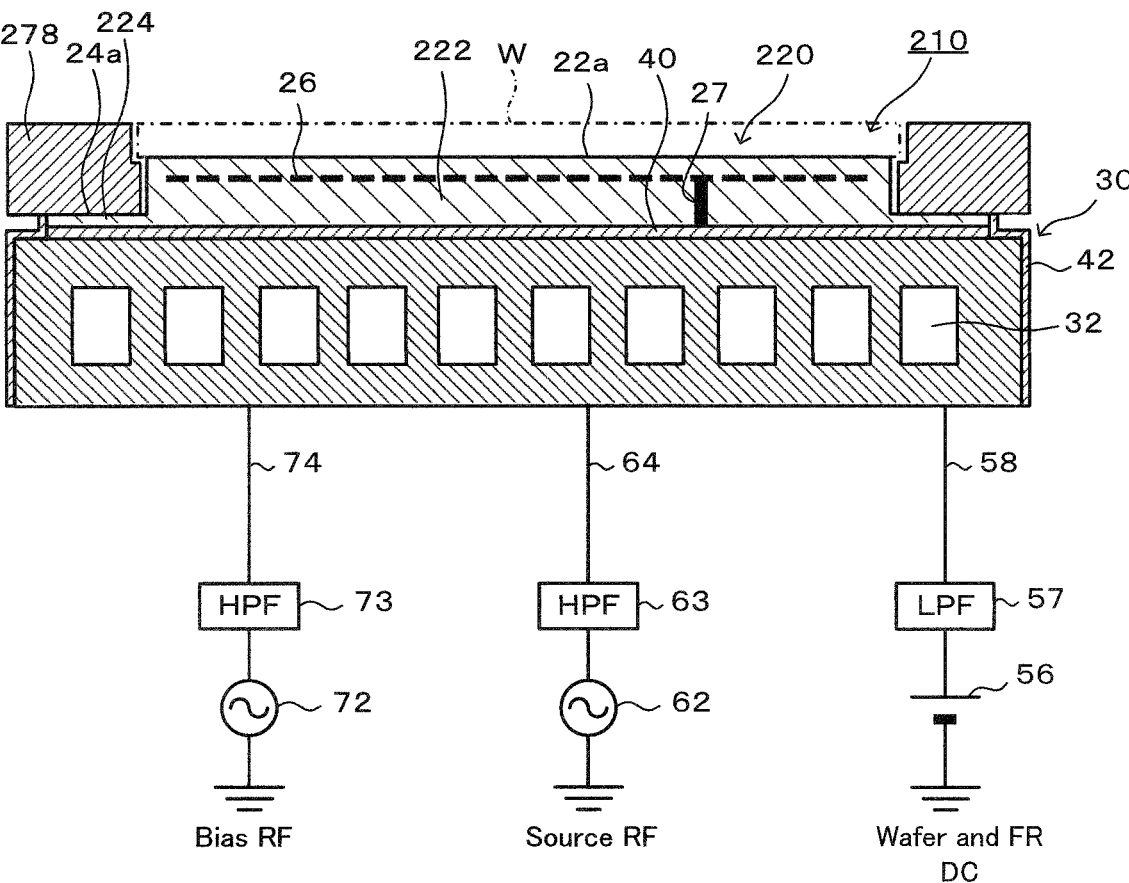
FIG. 7 is a longitudinal sectional view of a wafer placement table 210.
Figure 8:
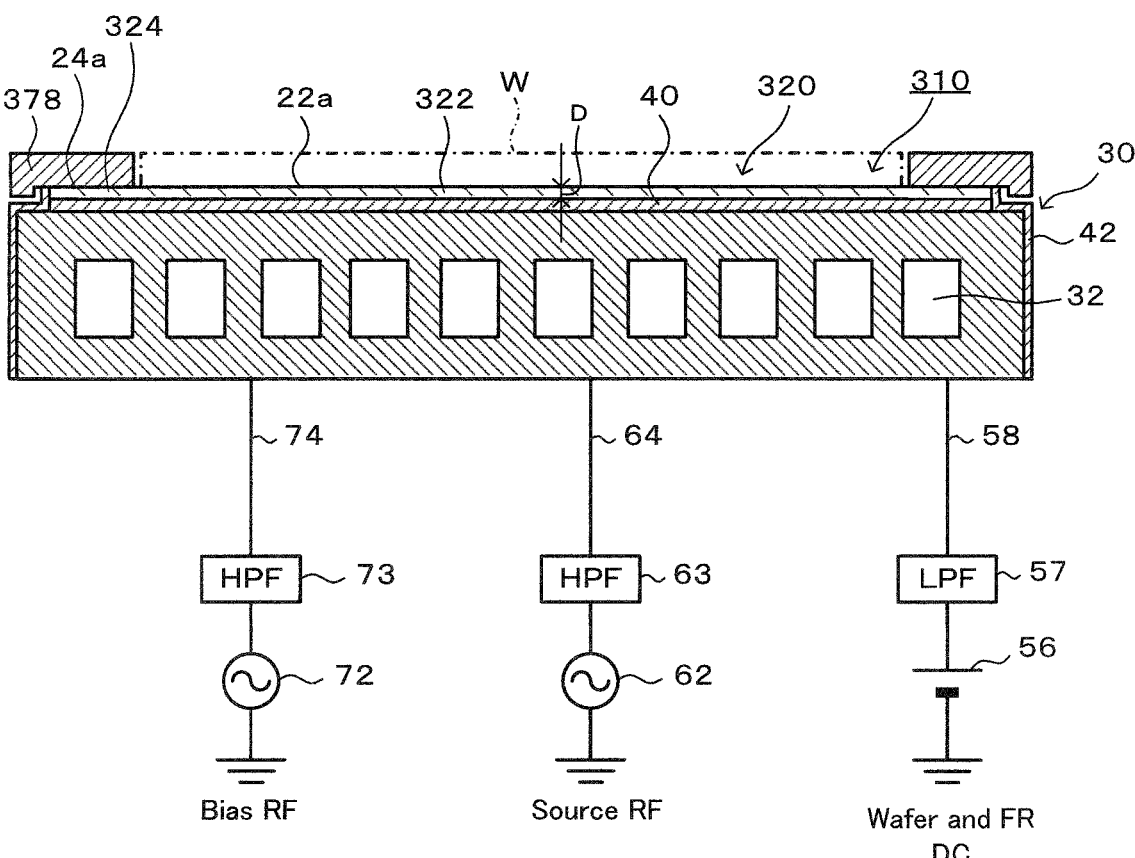
FIG. 8 is a longitudinal sectional view of a wafer placement table 310.

In the wafer placement table 10 of the above-described embodiment, the central part 22 of the ceramic base 20 incorporates the wafer attracting electrode 26 and the RF electrode 28; however, the configuration is not limited thereto. The central part 22 of the ceramic base 20 may be configured as in the case of, for example, wafer placement tables 110 to 310 shown in FIG. 6 to FIG. 8. In FIG. 6 to FIG. 8, like reference signs are assigned to components similar to those of the above-described embodiment.

In the wafer placement table 110 shown in FIG. 6, a central part 122 of a ceramic base 120 incorporates the wafer attracting electrode 26 but does not incorporate an RF electrode. Therefore, the overall thickness of the ceramic base 120 (the thickness of the central part 122) is able to be reduced as compared to the central part 22 of the above-described embodiment. The thickness of a focus ring 178 is able to be reduced as compared to the focus ring 78 of the above-described embodiment according to the thickness of the central part 122. An outer peripheral part 124, as in the case of the outer peripheral part 24, has a thickness less than or equal to 1 mm and does not incorporate an electrode. Therefore, when an FR attracting voltage is applied to the cooling base 30, the focus ring 178 is able to be electro-statically attracted to the FR placement surface 24a. When a bias RF voltage is applied to the cooling base 30, the reactance between the cooling base 30 and the FR placement surface 24a is small, so it is possible to efficiently draw ions to the focus ring 178 by the bias RF voltage. The bonding layer 40 that is a metal bonding layer also substantially serves as the FR attracting electrode, the FR-side source RF electrode, the FR-side bias RF electrode, the wafer-side source RF electrode, and the wafer-side bias RF electrode. In the wafer placement table 110, the structure is simple as compared to the case where the radio-frequency electrode 28 is incorporated in the ceramic base 20 as in the case of the wafer placement table 10.

In the wafer placement table 210 shown in FIG. 7, a central part 222 of a ceramic base 220 incorporates the wafer attracting electrode 26 but does not incorporate an RF electrode. Therefore, the overall thickness of the ceramic base 220 (the thickness of the central part 222) is able to be reduced as compared to the central part 22 of the above-described embodiment. The thickness of a focus ring 278 is able to be reduced as compared to the focus ring 78 of the above-described embodiment according to the thickness of the central part 222. The wafer attracting electrode 26 and the bonding layer 40 are connected by the electrically conductive via 27. Therefore, the power supply terminal 54 and the wafer attracting direct current power supply 52, shown in FIG. 1, are not necessary, and the FR attracting direct current power supply 56 also serves as a wafer attracting direct current power supply. An outer peripheral part 224, as in the case of the outer peripheral part 24, has a thickness less than or equal to 1 mm and does not incorporate an electrode. Therefore, when an FR attracting voltage is applied to the cooling base 30, the focus ring 278 is able to be electrostatically attracted to the FR placement surface 24a. When a bias RF voltage is applied to the cooling base 30, the reactance between the cooling base 30 and the FR placement surface 24a is small, so it is possible to efficiently draw ions to the focus ring 278 by the bias RF voltage. The bonding layer 40 that is a metal bonding layer also substantially serves as the FR attracting electrode, the FR-side source RF electrode, and the FR-side bias RF electrode. The wafer attracting electrode 26 also functions as a wafer-side source RF electrode and a wafer-side bias RF electrode. In the wafer placement table 210, the reactance between the wafer placement surface 22a and the wafer attracting electrode 26 that also serves as an RF electrode is further reduced as compared to the wafer placement tables 10, 110, so it is possible to further efficiently draw ions to the wafer W and generate plasma in the air over the wafer W. In the wafer placement table 210, the structure is simple as compared to when the wafer attracting electrode 26 is connected to the wafer attracting direct current power supply 52 without being connected to the cooling base 30 as in the case of the wafer placement tables 10, 110. Since it is not necessary to provide a through-hole for supplying electric power to the cooling base 30, it is possible to suppress generation of a temperature singular point.

In the wafer placement table 310 shown in FIG. 8, a central part 322 of a ceramic base 320 does not incorporate a wafer attracting electrode or an RF electrode. In this case, the overall thickness of the ceramic base 320 (the thickness of the central part 322) is able to be reduced as compared to the central parts 22, 122, 222 of FIG. 1, FIG. 6, and FIG. 7. The thickness of a focus ring 378 is able to be reduced according to the thickness of the central part 322. In FIG. 8, the thickness of the central part 322 is the same as the thickness of the outer peripheral part 324. The outer periph-eral part 324, as in the case of the outer peripheral part 24, has a thickness less than or equal to 1 mm and does not incorporate an electrode. Therefore, when an FR attracting voltage is applied to the cooling base 30, the focus ring 378 is able to be electrostatically attracted to the FR placement surface 24a. When a bias RF voltage is applied to the cooling base 30, the reactance between the cooling base 30 and the FR placement surface 24a is small, so it is possible to efficiently draw ions to the focus ring 378 by the bias RF voltage. In the wafer placement table 310, the overall thickness of the ceramic base 320 is able to be reduced as compared to the wafer placement tables 10, 110, 210, and the structure also becomes simple. Since it is not necessary to provide a through-hole for supplying electric power to the cooling base 30, it is possible to suppress generation of a temperature singular point. The thickness of the central part 322 may be increased as compared to the outer peripheral part 324 in consideration of strength and withstand voltage.

The cooling base 30 of the above-described embodiment has the refrigerant flow channel 32. Alternatively, the cool-ing base 30 does not need to have the refrigerant flow channel 32.

In the above-described embodiment, a ceramic mold is made by mold casting; however, the configuration is not limited thereto. For example, a ceramic mold may be made by laminating multiple sheets of tape mold. Alternatively, a ceramic sintered body 90 that incorporates the wafer attract-ing electrode 26 and the RF electrode 28 may be made by using first and third ceramic sintered bodies instead of the first and third ceramic molds 81, 83 of FIG. 3A, forming a ceramic powder layer between the first and third ceramic sintered bodies, and performing firing by hot pressing in this state.

A heater electrode may be embedded as needed in the ceramic base 20 of the above-described embodiment.

EXAMPLES

Hereinafter, examples of the present invention will be described. The following examples do not limit the present invention.

Example 1

Example 1 was the wafer placement table 10 shown in FIG. 1, an alumina substrate was used as the ceramic base 20, an SiSiCTi plate was used as the cooling base 30, and a TCB bonding layer made of an Al—Si—Mg bonding material was used as the bonding layer 40. The dielectric constant of alumina was 10 [F/m]. The diameter of the wafer placement surface 22a was 300 [mm], the outside diameter and inside diameter of the FR placement surface 24a were respectively 340 [mm] and 305 [mm], the distance Dwc (see FIG. 1) from the wafer placement surface 22a to the wafer attracting electrode 26 was 0.5 [mm], the distance Dwp (see FIG. 1) from the wafer placement surface 22a to the RF electrode 28 was 2.5 [mm], and the distance Df (see FIG. 1, and which is the same as the thickness of the outer peripheral part 24 in Example 1) from the FR placement surface 24a to the bonding layer 40 was 0.5 [mm].

Example 2

Example 2 was the wafer placement table 310 shown in FIG. 8, and the materials of the members were the same as those of Example 1. The diameter of the wafer placement surface 22a and the outside diameter and inside diameter of the FR placement surface 24a were the same as those of Example 1. The distance D (see FIG. 8) from the wafer placement surface 22a to the bonding layer 40 was 0.5 [mm]. The distance D corresponds to the distances Dwc, Dwp, Df of Example 1 because the bonding layer 40 also serves as the FR attracting electrode, the FR-side source RF electrode, the FR-side bias RF electrode, the wafer attracting electrode, the wafer-side source RF electrode, and the wafer-side bias RF electrode.

Comparative Example 1

Comparative Example 1 was similar to Example 1 except that, in Example 1, the thickness of the outer peripheral part 24 of the ceramic base 20 was 2.5 [mm], the FR attracting electrode was embedded in the outer peripheral part 24 at a depth of 0.5 [mm] from the FR placement surface 24a, and the FR attracting electrode was connected to the FR attracting direct current power supply via a power supply terminal (which is electrically insulated from the bonding layer or the cooling base).

Example 3

Example 3 was similar to Example 1 except that, in Example 1, the distance Dwc (see FIG. 1) was 1.0 [mm], the distance Dwp (see FIG. 1) was 3.0 [mm], the distance Df (see FIG. 1, which is the same as the thickness of the outer peripheral part 24 in Example 3) was 1.0 [mm].

Example 4

Example 4 was similar to Example 2 except that, in Example 2, the distance D (see FIG. 8) was 1.0 [mm].

Comparative Example 2

Comparative Example 2 was similar to Example 3 except that, in Example 3, the thickness of the outer peripheral part 24 of the ceramic base 20 was 3.0 [mm], the FR attracting electrode was embedded in the outer peripheral part 24 at a depth of 1.0 [mm] from the FR placement surface 24a, and the FR attracting electrode was connected to the FR attracting direct current power supply via a power supply terminal (which is electrically insulated from the bonding layer or the cooling base).

Results

For Examples 1, 2 and Comparative Example 1, the frequency of the source RF voltage was set to 50 [MHz], the frequency of the bias voltage was set to 500 [kHz], and the wafer attracting direct current voltage and the FR attracting direct current voltage each were set to 3 [kV]. The ratio of contact of an attracted object (the ratio of contact between the wafer placement surface 22a and the wafer W and the ratio of contact between the FR placement surface 24a and the focus ring 78) was 100[%]. For Examples 3, 4 and Comparative Example 2, the frequency of the source RF voltage was set to 50 [MHz], the frequency of the bias voltage was set to 500 [kHz], and the wafer attracting direct current voltage and the FR attracting direct current voltage each were set to 9 [kV]. The ratio of contact of the attracted object was 100[%].

The reactance between the FR placement surface and the bonding layer when the bias RF voltage was applied to the cooling base was calculated. As a result, the reactance was 101[$\Omega$] for Examples 1 and 2, and the reactance was 507[$\Omega$] for Comparative Example 1. The reactance was 203[$\Omega$] for Examples 3 and 4, and the reactance was 609[$\Omega$] for Comparative Example 2. The reactance between the FR placement surface and the bonding layer when the source RF voltage was applied to the cooling base was calculated. As a result, the reactance was 1.0[$\Omega$] for Examples 1 and 2, and the reactance was 5.1[$\Omega$] for Comparative Example 1. The reactance was 2.0[$\Omega$] for Examples 3 and 4, and the reactance was 6.1[$\Omega$] for Comparative Example 2.

In this way, in Examples 1 and 2, the reactance between the FR placement surface and the bonding layer when the bias RF voltage is applied to the cooling base is small as compared to Comparative Example 1, so it is possible to efficiently draw ions to the focus ring by the bias RF voltage. The same applies to Examples 3 and 4 as compared to Comparative Example 2. In Examples 1 and 2, the reactance between the FR placement surface and the bonding layer when the source RF voltage is applied to the cooling base is small as compared to Comparative Example 1, so it is possible to efficiently generate plasma in the air over the focus ring by the source RF voltage. The same applies to Examples 3 and 4 as compared to Comparative Example 2.

The present application claims priority from Japanese Patent Application No. 2021-132886, filed on Aug. 17, 2021, the entire contents of which are incorporated herein by reference.

What is claimed is:

1. A wafer placement table comprising:

a ceramic base that includes an outer peripheral part having an annular focus ring placement surface on an outer peripheral side of a central part having a circular wafer placement surface;

a cooling base containing metal; and a bonding layer that bonds the ceramic base with the cooling base, wherein the outer peripheral part of the ceramic base has a thickness of less than or equal to 0.7 mm and does not incorporate an electrode; and wherein the bonding layer is a metal bonding layer;

wherein parts exposed on a side surface of an outer peripheral part of the ceramic base, a periphery of the metal bonding layer, a side surface of the cooling base, and a top surface of the cooling base are coated with an electrically insulating film; and wherein a difference in coefficient of thermal expansion between the ceramic base and the cooling base is lower than or equal to $1 \times 10^{-6}$/K.

2. The wafer placement table according to claim 1, wherein the cooling base is connected to at least a focus ring attracting power supply, a bias radio-frequency power supply, and a source radio-frequency power supply.

3. The wafer placement table according to claim 1, wherein the central part of the ceramic base is thicker than the outer peripheral part, incorporates a wafer attracting electrode, and incorporates a radio-frequency electrode between the wafer attracting electrode and a surface on a side opposite to the wafer placement surface, the radio-frequency electrode is connected to the cooling base, and the wafer attracting electrode is connected to a wafer attracting power supply without being connected to the cooling base.

4. The wafer placement table according to claim 1, wherein the central part of the ceramic base is thicker than the outer peripheral part, incorporates a wafer attracting electrode, and does not incorporate a radio-frequency electrode between the wafer attracting electrode and a surface on a side opposite to the wafer placement surface, and the wafer attracting electrode is connected to a wafer attracting power supply without being connected to the cooling base.

5. The wafer placement table according to claim 1, wherein the central part of the ceramic base is thicker than the outer peripheral part, incorporates a wafer attracting electrode, and does not incorporate a radio-frequency electrode between the wafer attracting electrode and a surface on a side opposite to the wafer placement surface, the wafer attracting electrode is connected to the cooling base, and the cooling base is connected to a wafer attracting power supply.

6. The wafer placement table according to claim 1, wherein the central part of the ceramic base has the same thickness as the outer peripheral part of the ceramic base and does not incorporate an electrode, and the cooling base is connected to a wafer attracting power supply.

7. The wafer placement table according to claim 1, wherein the cooling base does not have a through-hole for supplying electric power.

8. The wafer placement table according to claim 1, wherein the outer peripheral part of the ceramic base has a thickness of less than or equal to 0.5 mm.

* * * * *